United States Patent
Taylor et al.

(10) Patent No.: US 7,250,815 B2
(45) Date of Patent: Jul. 31, 2007

(54) AMPLIFIER DISTORTION MANAGEMENT APPARATUS, SYSTEMS, AND METHODS

(75) Inventors: Stewart S. Taylor, Beaverton, OR (US); Ian A. Rippke, Ithaca, NY (US); Georgios Palaskas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 10/786,677

(22) Filed: Feb. 25, 2004

(65) Prior Publication Data

US 2005/0184802 A1 Aug. 25, 2005

(51) Int. Cl.
*H03F 1/36* (2006.01)

(52) U.S. Cl. .................... 330/107; 330/149

(58) Field of Classification Search ........ 330/107–151, 330/51, 52; 455/126, 103; 369/112, 13, 369/126, 1
See application file for complete search history.

(56) References Cited

U.S. PATENT DOCUMENTS

| | | | | |
|---|---|---|---|---|
| 3,573,770 | A * | 4/1971 | Norris | 360/43 |
| 5,003,316 | A * | 3/1991 | Ostermiller | 342/429 |
| 5,262,735 | A * | 11/1993 | Hashimoto et al. | 331/45 |
| 5,606,286 | A * | 2/1997 | Bains | 330/149 |
| 5,963,532 | A * | 10/1999 | Hajjar | 369/112.24 |
| 6,054,951 | A * | 4/2000 | Sypniewski | 342/465 |
| 6,111,840 | A * | 8/2000 | Hajjar | 369/112.02 |
| 6,175,302 | B1 * | 1/2001 | Huang | 340/442 |
| 6,194,978 | B1 * | 2/2001 | Romano | 332/107 |
| 6,275,685 | B1 * | 8/2001 | Wessel et al. | 330/149 |
| 6,288,606 | B1 * | 9/2001 | Ekman et al. | 330/107 |
| 6,388,518 | B1 * | 5/2002 | Miyatani | 330/107 |
| 6,396,345 | B2 * | 5/2002 | Dolman | 330/149 |
| 6,515,540 | B1 * | 2/2003 | Prasad et al. | 330/107 |
| 6,515,616 | B1 * | 2/2003 | Kuplicki | 342/174 |
| 6,597,244 | B2 * | 7/2003 | Tichauer | 330/298 |
| 6,654,591 | B1 * | 11/2003 | Hoffmann | 375/297 |
| 6,677,820 | B2 * | 1/2004 | Miyatani | 330/149 |

FOREIGN PATENT DOCUMENTS

JP 3198407 * 8/1991 ................ 330/107

OTHER PUBLICATIONS

Gilbert, Barrie, "Analog at Milepost 2000: A Personal Perspective", *Proceedings of the IEEE*, vol. 89, No. 3, (Mar. 2001), 289-304.

Gilbert, B, "Circuits for the precise synthesis of the sine function", *Electronics Letters*, 13(17), (Aug. 18, 1977), 506-8.

Gilbert, B, "Translinear circuits: a proposed classification", *Electronics Letters*, 11(1), (Jan. 1975), 14-16.

Gilbert, B, "Translinear circuits: an historical overview", *Analog Integrated Circuits and Signal Processing*, 9(2), (Mar. 1996), 95-118.

\* cited by examiner

*Primary Examiner*—Lam T. Mai
(74) *Attorney, Agent, or Firm*—Schwegman, Lundberg, Woessner & Kluth, P.A.

(57) ABSTRACT

An apparatus and a system, as well as a method and an article, may include detecting an indication of an amplifier output signal amplitude and responsively adjusting the amplifier input signal phase to reduce a change in the phase of the output signal.

21 Claims, 3 Drawing Sheets

AMPLIFIER DISTORTION MANAGEMENT APPARATUS, SYSTEMS, AND METHODS

TECHNICAL FIELD

Various embodiments described herein relate to the field of communications generally, including apparatus, systems, and methods for modulating and amplifying communications signals.

BACKGROUND INFORMATION

Linearity and control of nonlinear distortion may be used as criteria to judge the performance of amplifiers, including multi-channel power amplifiers (MCPAs). Amplifiers that have poorly controlled nonlinear distortion, including AM/PM (phase distortion) and AM/AM (amplitude distortion), may degrade signals on adjacent channels and deliver reduced signal quality on their own channels. Such amplifiers can also degrade the modulation quality on the signal, increasing the signal EVM (error vector magnitude).

Linearizing an amplifier may refer to adjusting its operation such that the output signal matches the input signal times a constant. Thus, if the amplifier does not amplify linearly, selected amounts of distortion may be added to either the input and/or output to correct for the nonlinearity. Amplifiers can use feedforward and predistortion techniques to improve linearity. Predistortion may be more popular because feedforward cancellation can be inefficient, at times becoming more difficult to implement when bandwidth increases. However, predistortion solutions sometimes involve increased complexity and larger die area, and/or they may improve AM/PM at the expense of AM/AM performance.

DETAILED DESCRIPTION

Various embodiments disclosed herein address some of the challenges described above by sensing an indication of the amplifier output signal amplitude (e.g., detecting the envelope of the current, voltage, or power) when AM/PM and/or AM/AM distortion occurs. A responsive signal, perhaps a translated version of the indication, may be sent to a variable tuning element, such as a variable capacitor (e.g., varactor), coupled to the input of an associated amplifying stage. By adjusting a control signal coupled to the tuning element, a pre-determined phase correction can be made, effectively pre-distorting the input signal to correct for the distortion of the remainder of the amplifier circuitry. Sensing the envelope of the amplitude and adjusting the input signal phase can operate to preserve the amplitude while correcting output signal phase distortion (AM/PM). It should be noted that the envelope of a modulated RF (radio frequency) signal may change at a relatively slow rate comparable to the bandwidth of the modulation signal.

Figure 1:
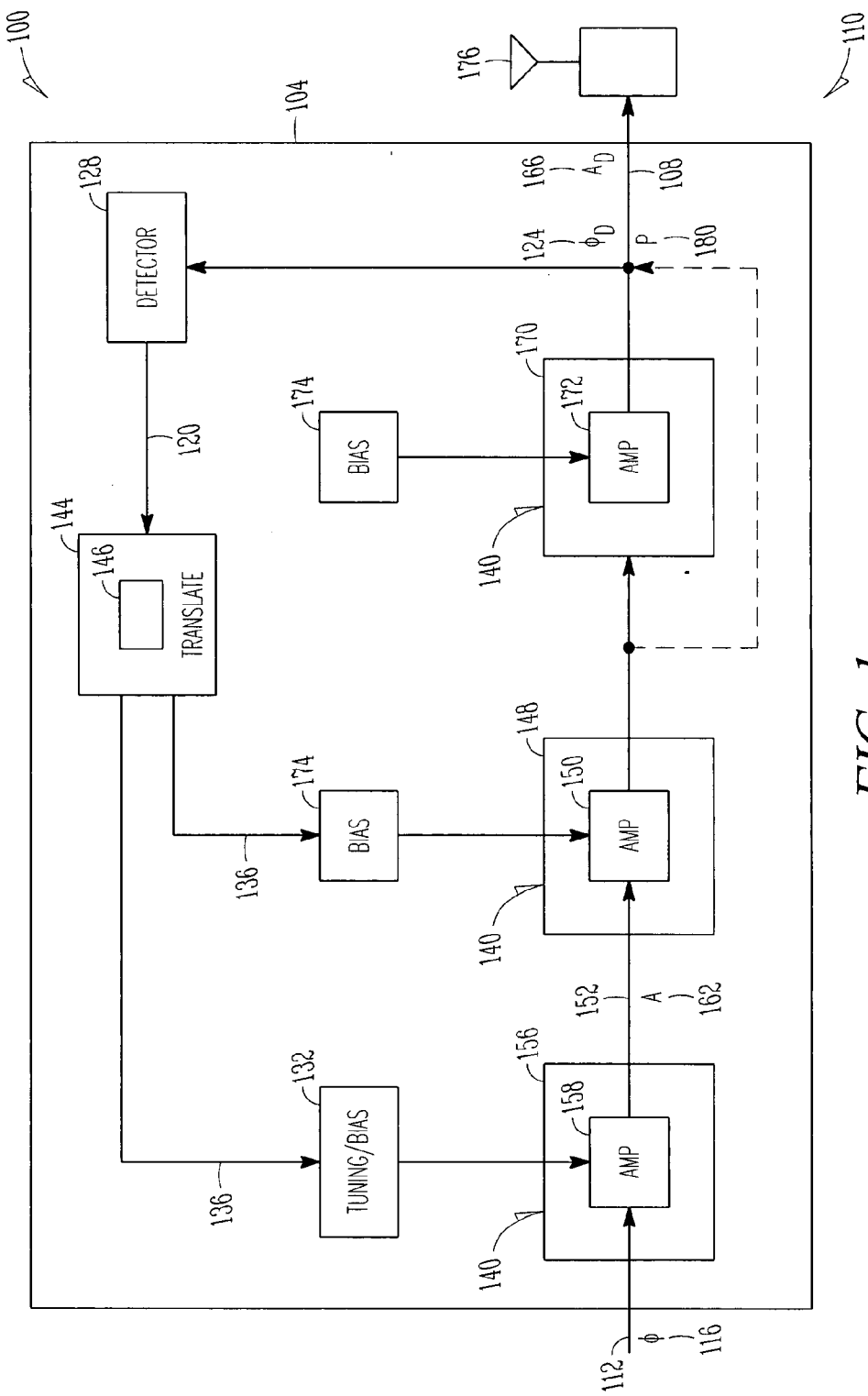
FIG. 1 is a block diagram of an apparatus and a system according to various embodiments.

FIG. 1 is a block diagram of an apparatus 100 and a system 110 according to various embodiments, each of which may operate in the manner described. Included in the apparatus 100 and system 110 may be a three-stage power amplifier with an adjustable tuning element (e.g., a varactor) for controlling phase distortion. One or two-stage embodiments may also be realized; sufficient phase tuning range and gain may be more difficult to achieve with fewer stages.

As shown, an indication of the detected signal can be passed to translation circuitry that may produce an output signal (e.g., current or voltage) that is a function of the detector output signal (e.g., the indication). The translation circuitry, which may include offset, gain, and/or law conformance circuits, might have an output including a piecewise linear approximation to a known function, or an approximation to a hyperbolic tangent or a square-root function, for example. Such functions can be implemented or approximated using translinear, multi-tanh, and other circuits known to those skilled in the art. The precise translation used may depend on the biasing of various amplifier stages, and on which stages in the amplifier apparatus are being controlled. For more information regarding translinear, conformance law, and other circuits suitable for use as part of the translation circuitry illustrated in FIG. 1, please refer to the following articles: *Translinear Circuits: A Proposed Classification* by Barrie Gilbert, Electronics Letters, Pgs. 14–16, Vol. 11, No. 1, January 1975; *Circuits for the Precise Synthesis of the Sine Function* by Barrie Gilbert, Electronics Letters, Pgs. 506–508, Vol. 13, No. 17, August 1977; *Translinear Circuits: An Historical Overview* by Barrie Gilbert, Analog Integrated Circuits and Signal Processing, Pgs. 95–118, Kluwer Academic Publishers, Boston, 1996; and *Analog at Milepost 2000: A Personal Perspective* by Barrie Gilbert, Proceedings of the Institute of Electrical and Electronics Engineers, pgs. 289–304, Vol. 89, No. 3, March 2001.

The size of the tuning element, such as a varactor, may affect its tuning range. If the range is large, AM/AM performance can be negatively affected, in which case the bias of another stage may be adjusted to compensate. One or more distortion correction signals (e.g., tuning element control to adjust phase, bias control to adjust phase, tuning element control to adjust amplitude, and bias control to adjust amplitude) can be provided to various stages by one or more translation circuit output signals, after receiving the indication of the output amplitude from the detector. By adjusting the tuning and/or bias, each stage within the apparatus (e.g., amplifier) can be made to produce a cascaded AM/AM and AM/PM characteristic for the entire apparatus to satisfy particular performance requirements.

The use of such techniques may result in significant performance improvements. For example, in the laboratory, the AM/PM improvement achieved by using the disclosed phase distortion compensation technique in a two-stage embodiment was approximately 20 degrees in the high power region.

As another example, an untuned power amplifier under orthogonal frequency division multiplexing (OFDM) modulation with a data rate of 54 Mbps (megabits-per-second) was discovered to have an EVM of more than 6% at an output power of 19 dBm (decibels referred to 1 milliwatt). Gain compression (AM/AM) effects, which would further increase the EVM, were not counted. Without correction, the untuned power amplifier might not provide compliance with many communications standards.

By applying phase distortion compensation to this same amplifier in the manner disclosed herein, the overall phase shift was found in laboratory testing to be reduced to 5 degrees over the entire operating range. Under the same test conditions, the EVM due to phase distortion was found to be about 2.5%, and even when AM/AM was counted, to be only about 3.5%. Based on these results, the tested amplifier would be suitable for use in many products, including those conforming to an Institute of Electrical and Electronics Engineers (IEEE) 802.11 protocol standard. For more information on the various IEEE 802.11 standards, please refer to "IEEE Standards for Information Technology—Telecommunications and Information Exchange between Systems—Local and Metropolitan Area Network—Specific Requirements—Part 11: Wireless LAN Medium Access Control (MAC) and Physical Layer (PHY), ISO/IEC 8802-11: 1999" and related versions.

Therefore, as shown in FIG. 1, an apparatus 100 may include an amplifier 104 to produce an output signal 108 and to receive an input signal 112 including an adjustable phase 116 to be adjusted in response to an indication 120 of the amplitude of the output signal 108 to reduce and/or minimize a phase distortion 124. For the purposes of this document, the term "minimize" as used herein means to reduce a named quantity from a selected or measured greater value to less than or equal to about a preselected lesser value, such as reducing a phase distortion (the named quantity) from a measured value of 0.1% to a preselected lesser value of less than or equal to about 0.01%.

Many elements may be used to provide the indication 120. For example, the apparatus 100 may include a detector 128, such as an envelope detector or peak detector to detect the indication 120 of the output signal 108 amplitude.

Similarly, many elements may provide a mechanism to adjust the phase 116. For example, the apparatus 100 may include a tuning element 132, such as a capacitor (e.g., a varactor), an inductor, and/or a resistor, wherein the adjustable phase 116 is to be adjusted by translating the indication 120 of the amplitude into a control signal 136 to control the tuning element 132 (e.g., varactor) coupled to one or more of the stages 140 included in the amplifier 104.

As noted above, the apparatus 100 may include one or more translation circuits 144 to transform the indication 120 of the amplitude into a control signal 136 to adjust the adjustable phase 116. The translation circuit 144 may include one or more sub-circuits 146, such as translinear and/or conformance law circuits, and/or offset and gain functions.

Those of skill in the art will realize, after reading the material disclosed herein, that the apparatus 100 does not function in the same manner as a phase-locked loop (PLL), for example, wherein the output signal phase is measured (rather than an indication of the amplitude) and the input phase is adjusted in response. Such corrections usually require a high level of loop gain, whereas the disclosed translation circuit 144 usually does not. In fact, in most embodiments, the translation circuit 144 may be designed to provide a loop gain of less than about two, and in some embodiments, to provide a loop gain of less than about one. In conventional PLL circuitry, such low loop gains would not permit the PLL to function properly. In some embodiments of the invention, amplitude and phase may be substantially independent.

In some embodiments, an apparatus 100 may include a first stage 148 including a first amplifier 150 responsive to a first input signal 152 and a second stage 156 coupled to the first stage 148, the second stage 156 including a second amplifier 158 responsive to a second input signal 112. The second input signal 112 may include an adjustable phase 116 to be adjusted in response to an indication 120 of an output signal amplitude to reduce and/or minimize phase distortion 124. The first input signal 152 may include an adjustable amplitude 162 to be adjusted to reduce and/or minimize an amplitude distortion 166. Thus, the second stage 156 may be used to provide the output signal 108. In some embodiments, the apparatus 100 may also include a third stage 170 having a third amplifier 172 to provide the output signal 108, and the third stage 170 may be coupled to the second stage 148.

The translation circuit 144 (which may include one or more sub-circuits 146, such as law conformance circuits) may be designed to perform a predetermined mathematical operation on the indication 120 of the amplitude (e.g., a signal provided by a detector 128, such as a power detector) to produce currents or voltages coupled to the bias circuitry 174 for some or all of the stages 140.

For example, as shown in FIG. 1, the bias current in the stage 148 may be adjusted so that the AM/PM behavior of the stage 148 complements that of the stage 170, which may include a class AB amplifier designed for high gain and high efficiency (sometimes leading to significant AM/PM distortion). Stage 148 may then be adjusted, via the bias circuitry 174, to have its bias current increase with output power to achieve a complementary AM/PM characteristic to that of stage 170.

Such activity may cause significant AM/AM distortion in stage 148, due to gain expansion. To offset such distortion, stage 156 may include a broadband class A amplifier that has bias current (and therefore gain) decreasing with increasing output power. Another option includes the use of a current-steering variable gain amplifier in the stage 156 that has a gain that can be varied with the applied control signal 136. This may help keep the gain of the apparatus 100 relatively constant. In these circumstances, if the stage 156 operates using a broadband, class A amplifier (or a variable-gain amplifier), it may have very little AM/PM distortion. Such an arrangement may also permit using less power and bias current than with other implementations. It is also possible that the bias voltage of one or more cascode devices used in stages 148 and/or 156 can be varied as a result of using the translation circuit 144 to enhance performance (e.g., operating so that phase decreases when a common gate stage is operated in compression).

The bias circuits 174 may include current mirrors that receive an input current from the translation circuit 144. Output signals (e.g., voltages or currents) from the bias circuits 174 may be fed directly into the stages 140 (e.g., into the gate of a corresponding amplifier 150, 158, 172, perhaps using an isolating resistor). The detector 128, which may be a power detector, can include a voltage or current sensing circuit employing rectification and a suitable filter, such as may be used in envelope detection.

Still other embodiments may be realized. For example, some embodiments of an apparatus 100 may include a first stage 148 having a first amplifier 150 responsive to a first input signal 152, and a second stage 156 coupled to the first stage 148. The second stage 156 may include a second amplifier 158 responsive to a second input signal 112, wherein the second input signal 112 includes an adjustable phase 116 to be adjusted in response to an indication 120 of an amplitude of an output signal 108 to reduce and/or minimize a phase distortion 124. The first input signal 152 may include an adjustable amplitude 162 to be adjusted to reduce and/or minimize an amplitude distortion 166

The apparatus 100 may also include a translation circuit 144, which may comprise one or more sub-circuits 146 (such as one or more translinear circuits and/or conformance law circuits, and/or offset circuits, and/or gain circuits), to be coupled to the second input signal 112 and the indication 120, and to be used to adjust the adjustable phase 116. The apparatus 100 may also include a third stage 170 including a third amplifier 172 to provide the output signal 108, and the third stage 170 may be coupled to the second stage 148. The sub-circuits 146, which may include one or more translinear circuits, among others, may be used to approximate a mathematical function. The apparatus 100 may also include a varactor, perhaps as part of the tuning element 132, to couple the one or more of the sub-circuits 146, such as a translinear circuit, to the second input signal 112.

Yet other embodiments may be realized. For example, a system 110 may include one or more of the apparatus 100 described previously, as well as an antenna 176, including an omnidirectional, monopole, dipole, and/or patch antenna coupled to one or more of the stages 140, including the amplifiers 104, 150, 158, 172. As can be seen in FIG. 1, the system 110 may also include a translation circuit 144 to transform the indication 120 of the amplitude into a control signal 136 to adjust the adjustable phase 116. The system 110 may include a tuning element 132, perhaps selected from a capacitor and an inductor, to receive the control signal 136 and to adjust the adjustable phase 116. In some embodiments, the adjustable phase 116 may be adjusted while leaving a signal amplitude 166 associated with the stages 140, including any one or more of the amplifiers 104, 150, 158, 172, substantially unchanged. This type of operation may occur such that the phase distortion 116 of the stages 140, including any one or more of the amplifiers 104, 150, 158, and 172 is reduced and/or minimized while a power output 180 of the stages 140, including any one or more of the amplifiers 104, 150, 158, and 172 is increased from a first selected level to a second selected level. In some embodiments, at least a portion (or all) of the amplifiers 104, 150, 158, and 172 may include complementary metal oxide semiconductor (CMOS) technology.

Figure 2:
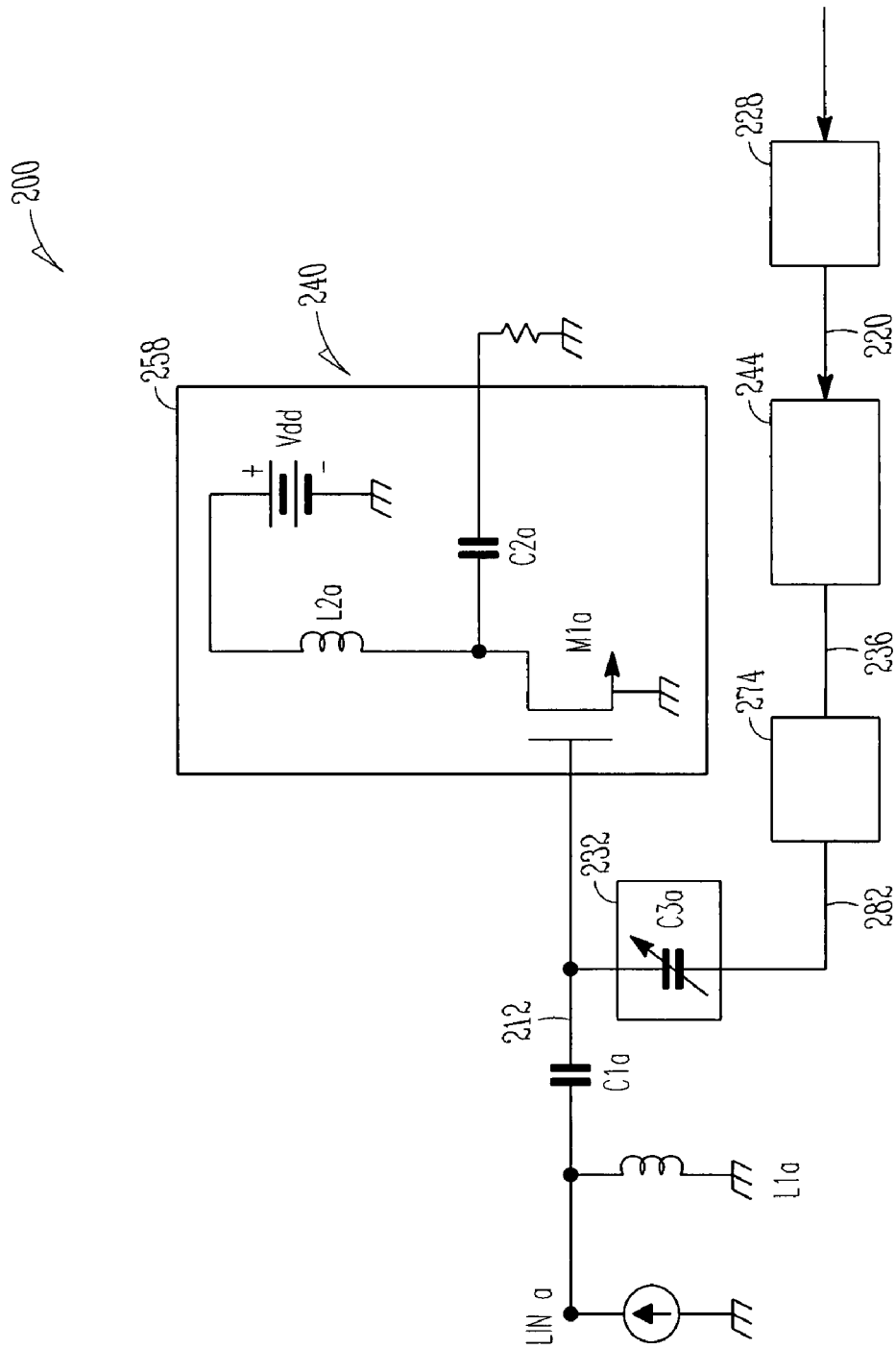
FIG. 2 is a schematic diagram of an apparatus according to various embodiments.

FIG. 2 is a schematic diagram of an apparatus 200 according to various embodiments. The apparatus 200 may be similar to or identical to the apparatus 100 (see FIG. 1). The schematic illustrates a circuit implementation of an apparatus 200 that can be used for phase correction with respect to an amplifier 258, such as a power amplifier forming a portion of an amplification stage 240. The control signal 236 provided by a translation circuit 244, possibly including one or more law conformance circuits, perhaps derived from an indication 220 provided by a detector 228, may be used to create a bias signal 282 (perhaps via bias circuitry 274) that adjusts the value of the capacitor C3a (which may be included as part of a tuning element 232). By adjusting the tuning element 232 in this manner, a phase shift may be introduced in the input signal 212 at the input of the amplifier 258 while not adversely affecting the gain of the overall apparatus 200. If a larger phase tuning range is necessary than can be provided by the capacitor (e.g., a varactor C3a), another stage may be used, as shown in FIG. 1.

The apparatus 100, 200, amplifiers 104, 150, 158, 172, 258, output signal 108, systems 110, input signals 112, 212, adjustable phase 116, indication 120, phase distortion 124, detector 128, tuning element 132, control signals 136, 236, stages 140, 148, 156, 170, 240, translation circuits 144, 244, sub-circuits 146, adjustable amplitude 162, amplitude distortion 166, bias circuitry 174, 274, antenna 176, power output 180, bias signal 282, and capacitor C3a, may all be characterized as "modules" herein. Such modules may include hardware circuitry, and/or a processor and/or memory circuits, software program modules and objects, and/or firmware, and combinations thereof, as desired by the architect of the apparatus 100, 200, and systems 110, and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, and/or a combination of software and hardware used to simulate the operation of various potential embodiments.

It should also be understood that the apparatus and systems of various embodiments can be used in applications other than for base stations and MCPAs, and other than for systems that include wireless data communications, and thus, various embodiments are not to be so limited. The illustrations of apparatus 100, 200 and systems 110 are intended to provide a general understanding of the structure of various embodiments, and they are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, processor modules, embedded processors, data switches, and application-specific modules, including multilayer, multi-chip modules. Such apparatus and systems may further be included as sub-components within a variety of electronic systems, such as televisions, cellular telephones, personal computers, workstations, radios, video players, vehicles, and others. Some embodiments include a number of methods.

Figure 3:
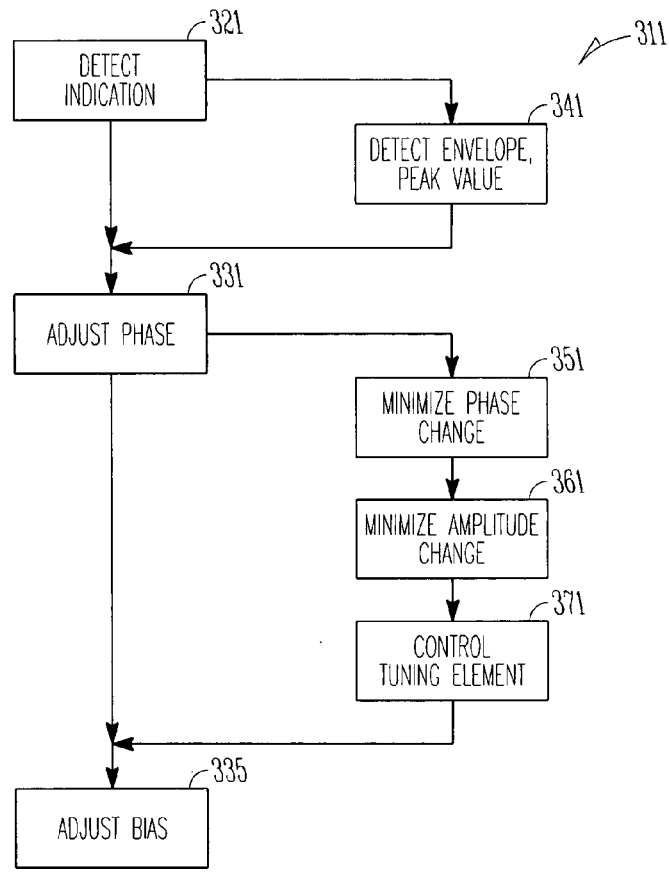
FIG. 3 is a flow chart illustrating several methods according to various embodiments.

For example, FIG. 3 is a flow chart illustrating several methods 311 according to various embodiments. For example, a method 311 may (optionally) begin at block 321 with detecting an indication of an amplifier output signal amplitude, and continue with adjusting the phase of an input signal to the amplifier (responsive to the indication) to reduce a change in the output signal phase at block 331. The method 311 may also include adjusting a bias value of an amplification stage included in the amplifier to reduce amplitude distortion included in the output signal at block 335. The amplifier may include one, two, or more amplification stages.

Detecting the indication of the amplitude at block 321 may include detecting an envelope of the amplitude of the output signal, and/or detecting a peak value of the amplitude of the output signal at block 341. The indication of the output signal amplitude may include an output signal power value.

Adjusting the input signal phase may include reducing and/or minimizing a change in the phase of the output signal at block 351, and/or reducing and/or minimizing a change in the output signal amplitude at block 361, as well as controlling a variable tuning element selected from a capacitor and an inductor at the input of an amplification stage included in the amplifier at block 371.

It should be noted that the methods described herein do not have to be executed in the order described, or in any particular order. Moreover, various activities described with respect to the methods identified herein can be executed in serial or parallel fashion. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java, Smalltalk, or C++. Alternatively, the programs can be structured in a procedure-orientated format using a procedural language, such as assembly or C. The software components may communicate using any of a number of mechanisms well known to those skilled in the art, such as application program interfaces or interprocess communication techniques, including remote procedure calls. The teachings of various embodiments are not limited to any particular programming language or environment, including Hypertext Markup Language (HTML) and Extensible Markup Language (XML). Thus, other embodiments may be realized.

Figure 4:
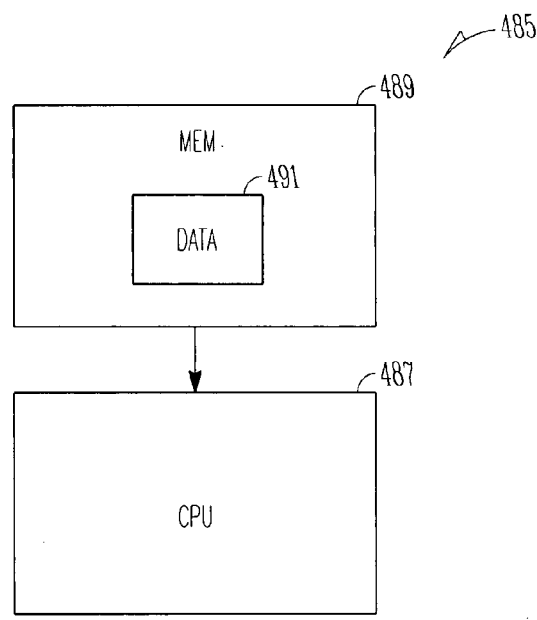
FIG. 4 is a block diagram of an article according to various embodiments.

FIG. 4 is a block diagram of an article 485 according to various embodiments, such as a computer, a memory system, a magnetic or optical disk, some other storage device, and/or any type of electronic device or system. The article 485 may include a processor 487 coupled to a machine-accessible medium such as a memory 489 (e.g., a memory including an electrical, optical, or electromagnetic conductor) having associated information 491 (e.g., computer program instructions and/or data), which, when accessed, results in a machine (e.g., the processor 487) performing such actions as detecting an indication of an amplifier output signal amplitude and adjusting a phase of an input signal to the amplifier (responsive to the indication) to reduce a phase change in the output signal. Adjusting the phase of the input signal may further include controlling a variable tuning element selected from a capacitor and an inductor at the input of an amplification stage included in the amplifier. The information 491, when accessed, may result in the machine performing the activity of adjusting a bias value of the amplification stage to reduce amplitude distortion included in the output signal. As noted previously, the amplifier may include one, two, or more stages.

Implementing the apparatus, systems, and methods disclosed herein may result in improving AM/PM and AM/AM performance in various amplifiers, including CMOS power amplifiers. Other advantages may include improving EVM and linearity, as well as lowering the complexity of circuitry needed to reduce distortion and the die area required. In some embodiments, independent adjustments might be possible, and AM/PM distortion may be corrected/improved without degrading AM/AM performance.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus, including:
an amplifier to produce an output signal and to receive an input signal including an adjustable phase to be adjusted in response to an indication of an amplitude of the output signal to reduce a phase distortion; and
a translation circuit to transform the indication of the amplitude into a control signal to adjust the adjustable phase, wherein the translation circuit is to provide a loop gain of less than about one.

2. The apparatus of claim 1, further including:
an envelope detector to detect the indication of the amplitude.

3. The apparatus of claim 1, further including:
a varactor, wherein the adjustable phase is to be adjusted by translating the indication of the amplitude into a control signal to control the varactor.

4. The apparatus of claim 1, wherein the translation circuit includes at least one of an offset circuit, a gain circuit, and/or a law conformance circuit.

5. The apparatus of claim 1, wherein at least a portion of the amplifier includes complementary metal oxide semiconductor (CMOS) technology.

6. An apparatus, including:
a first stage including a first amplifier responsive to a first input signal; and
a second stage coupled to the first stage, the second stage including a second amplifier responsive to a second input signal, wherein the second input signal includes an adjustable phase to be adjusted in response to an indication of an amplitude of an output signal to reduce a phase distortion, and wherein the first input signal includes an adjustable amplitude to be adjusted to reduce an amplitude distortion.

7. The apparatus of claim 6, wherein the second stage is to provide the output signal.

8. The apparatus of claim 6, further including:
a third stage including a third amplifier to provide the output signal, wherein the third stage is coupled to the second stage.

9. A system, including:
an amplifier to produce an output signal and to receive an input signal including an adjustable phase to be adjusted in response to an indication of an amplitude of the output signal to reduce a phase distortion of the amplifier, wherein the adjustable phase is capable of being adjusted while leaving a signal amplitude associated with the amplifier substantially unchanged; and
an omnidirectional antenna coupled to the amplifier.

10. The system of claim 9, further including:
a translation circuit to transform the indication of the amplitude into a control signal to adjust the adjustable phase.

11. The system of claim 10, further including:
a tuning element selected from a capacitor and an inductor, the tuning element to receive the control signal to adjust the adjustable phase.

12. The system of claim 9, wherein the phase distortion of the amplifier is capable of being reduced while a power output of the amplifier is increased from a first selected level to a second selected level.

13. A method, including:
detecting an indication of an amplitude of an output signal of an amplifier; and
adjusting a phase of an input signal of the amplifier responsive to the indication to reduce a change in a phase of the output signal, wherein the indication is transformed into a control signal, and wherein a tuning element selected from a capacitor and an inductor is used to receive the control signal to adjust the adjustable phase.

14. The method of claim 13, wherein detecting the indication of the amplitude of the output signal further includes:
detecting an envelope of the amplitude of the output signal.

15. The method of claim 13, wherein detecting the indication of the amplitude of the output signal further includes:
detecting a peak value of the amplitude of the output signal.

16. The method of claim 13, wherein the indication of the amplitude of the output signal includes an output signal power value.

17. The method of claim 13, wherein adjusting the phase of the input signal further includes:
reducing the change in the phase of the output signal.

18. The method of claim 13, wherein adjusting the phase of the input signal further includes:
reducing a change in the amplitude of the output signal.

19. An apparatus, including:
a first stage including a first amplifier responsive to a first input signal;
a second stage coupled to the first stage, the second stage including a second amplifier responsive to a second input signal, wherein the second input signal includes an adjustable phase to be adjusted in response to an indication of an amplitude of an output signal to reduce a phase distortion, and wherein the first input signal includes an adjustable amplitude to be adjusted to reduce an amplitude distortion;
a translinear circuit to be coupled to the second input signal and to the indication, and to adjust the adjustable phase; and
a third stage including a third amplifier to provide the output signal, wherein the third stage is coupled to the second stage.

20. The apparatus of claim 19, wherein the translinear circuit is to approximate a mathematical function.

21. The apparatus of claim 19, further including:
a varactor to couple the translinear circuit to the second input signal.

* * * * *